US012506485B1

United States Patent
Belin et al.

(10) Patent No.: US 12,506,485 B1
(45) Date of Patent: Dec. 23, 2025

(54) DUAL MODE PLL FOR PHASE COHERENT APPLICATION

(71) Applicant: NXP B.V., Eindhoven (NL)

(72) Inventors: Philippe Christian Belin, Mezidon Vallée d'Auge (FR); Laurent Gambus, Cuverville (FR); Mathieu Périn, Cairon (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 18/825,171

(22) Filed: Sep. 5, 2024

(30) Foreign Application Priority Data

Jul. 4, 2024 (EP) ..................... 24306118

(51) Int. Cl.
*H03L 7/099* (2006.01)
*H03L 7/093* (2006.01)
*H03L 7/107* (2006.01)

(52) U.S. Cl.
CPC .............. *H03L 7/099* (2013.01); *H03L 7/093* (2013.01); *H03L 7/1075* (2013.01)

(58) Field of Classification Search
CPC ........ H03L 7/099; H03L 7/093; H03L 7/1075
See application file for complete search history.

(56) References Cited

U.S. PATENT DOCUMENTS

| | | | |
|---|---|---|---|
| 6,112,068 A | 8/2000 | Smith et al. | |
| 6,300,838 B1 * | 10/2001 | Kelkar | H03L 7/0891 331/11 |
| 6,538,518 B1 | 3/2003 | Chengson | |
| 7,315,214 B2 | 1/2008 | Badets et al. | |
| 7,433,657 B2 | 10/2008 | Liang et al. | |
| 8,094,769 B2 * | 1/2012 | Bhagavatheeswaran | H03L 7/099 375/376 |
| 8,299,826 B2 | 10/2012 | Perrott | |
| 11,114,978 B2 | 9/2021 | Perin et al. | |
| 11,489,532 B2 | 11/2022 | Perin et al. | |
| 11,545,982 B2 | 1/2023 | Perin et al. | |
| 2008/0136535 A1 | 6/2008 | Khorram | |
| 2014/0241335 A1 | 8/2014 | Chen et al. | |
| 2016/0047841 A1 * | 2/2016 | Fukuma | H03D 3/007 850/5 |
| 2017/0005593 A1 * | 1/2017 | Tada | H02M 7/53871 |

* cited by examiner

*Primary Examiner* — Sibin Chen (57) ABSTRACT

A method of operation for a dual mode Phase-Locked Loop (PLL) for phase coherent application includes selecting one of a non-coherent mode and a coherent mode. The non-coherent mode includes controlling a Voltage Controlled Oscillator (VCO) with a first error voltage determined by a first Low Pass Filter (LPF), the first LPF configured to filter a first output of a phase detector, the phase detector configured to determine a phase difference between a reference frequency and a feedback signal derived from a VCO frequency generated by the VCO. The coherent mode includes controlling the VCO with the first error voltage and a second error voltage determined by a second LPF of a Proportional and Integral Controller (PIC) configured to filter the first output of the phase detector and by a time variant proportional gain configured to modify a second output of the second LPF.

20 Claims, 11 Drawing Sheets

FIG. 12
PLL In Non-Coherent Mode

FIG. 13
PLL In Coherent Mode

DUAL MODE PLL FOR PHASE COHERENT APPLICATION

CROSS-REFERENCE TO RELATED APPLICATION

This application claims priority under 35 U.S.C. § 119 to European patent application no. 24306118.1, filed 4 Jul. 2024, the contents of which are incorporated by reference herein.

TECHNICAL FIELD

This disclosure relates generally to Phase-Locked Loops (PLLs), and more specifically to a dual mode PLL optimized for both coherent and non-coherent applications.

BACKGROUND

In phase based ranging applications, the PLL output oscillator phase should be phase coherent, predictable and independent of any calibration errors associated with the input oscillator. The PLL should also settle to the coherent steady state quickly. Conversely, when the PLL is in a non-coherent mode, power consumption should be reduced.

For a type 1 PLL in the non-coherent mode, the PLL bandwidth is proportional to the Voltage Controlled Oscillator (VCO) gain. The Low Path Filter (LPF) following the PLL phase detector may have a cut off frequency set for an optimum PLL phase margin and phase detector ripple rejection. In the coherent mode, to achieve faster locking time, the PLL bandwidth and the low path filter cut off frequency are typically increased at the same time.

In steady state, to achieve the same PLL loop bandwidth, damping factor and phase detector ripple rejection, the LPF should have the same characteristics in both coherent and non-coherent modes. Each capacitive element of the LPF may have a ripple signal from the phase detector at the comparison period. If any element of the LPF is changed dynamically, the time for the PLL to return to a steady state phase may be too slow. Furthermore, dynamic capacitor switching may result in charge injection that will disturb the PLL loop and slow-down the steady state recovery.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments described herein provide for a PLL, which may be operated in a coherent mode with fast settling time and a temporarily increased bandwidth, as well as a non-coherent mode with reduced power consumption. Both coherent and non-coherent modes retain the same PLL loop bandwidth and stability in steady state. Phase coherency is obtained by using dual LPFs, a PLL with a time varying proportional gain and selectable coherent and non-coherent modes. The coherent mode includes a PIC with a dedicated LPF. The coherent mode means that the generated output has a phase that is fixed relative to a phase of the input reference frequency. When a phase error may be tolerated, a non-coherent mode may offer reduced power consumption. Amongst other advantages, the use of dual LPFs mitigates the issues of dynamic capacitor switching, injected noise and increased settling time to steady state that may be present in a PLL based on a single LPF.

Figure 1:
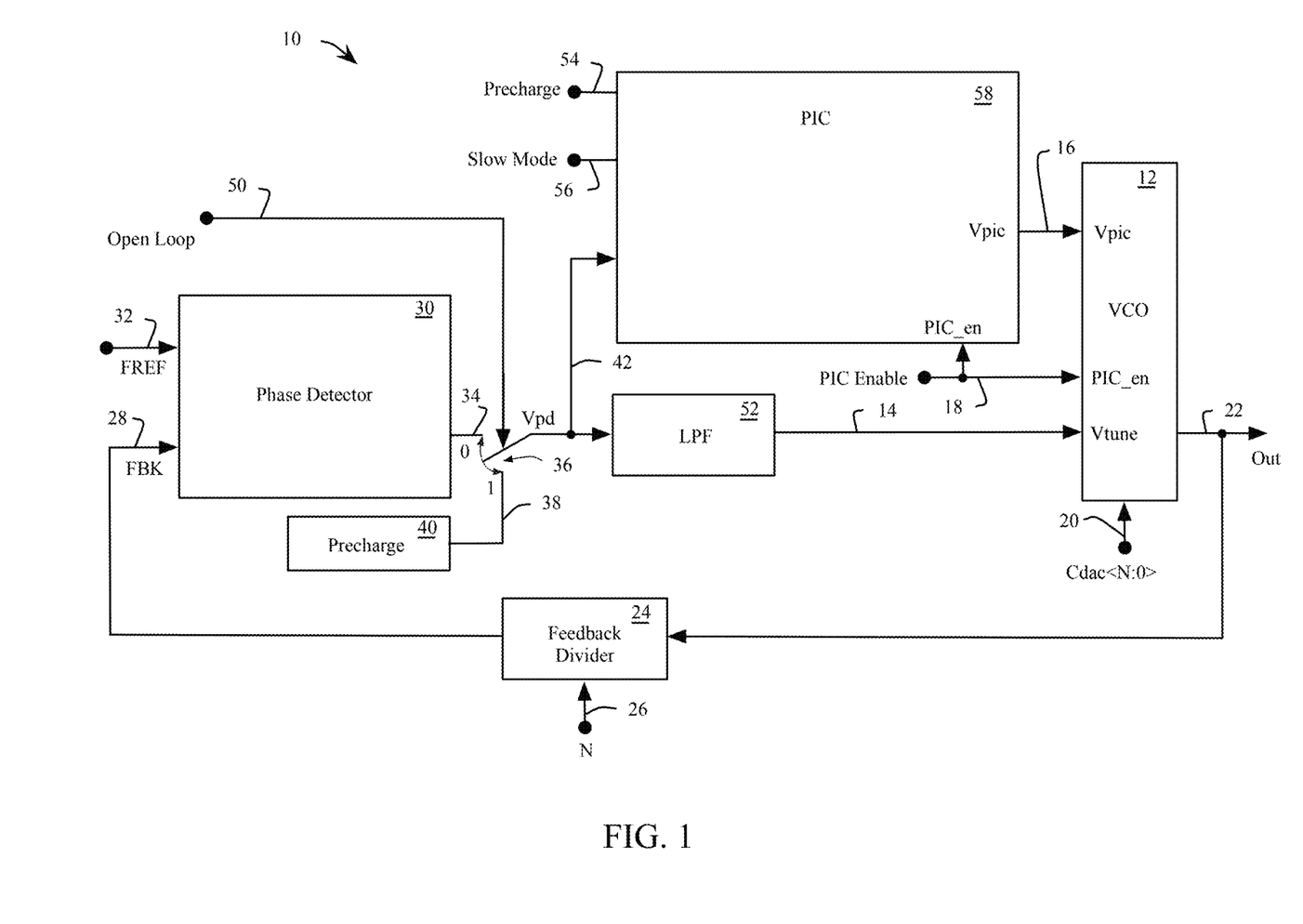
FIG. 1 is a schematic view of a system for a dual mode PLL for phase coherent application, in accordance with an embodiment of the present disclosure.

FIG. 1 shows a system for a dual mode PLL for phase coherent application, in accordance with an embodiment 10 of the present disclosure. The embodiment 10 includes a VCO 12 controlled by a first error voltage 14 ("Vtune"), a second error voltage 16 ("Vpic"), a PIC enable 18 and a capacitive Digital to Analog Converter (DAC) selection 20. The VCO 12 generates a VCO output 22 having a VCO frequency. In one embodiment, the VCO output 22 is divided by a feedback divider 24 by a divisor value ("N") 26 to generate a feedback frequency ("FBK") 28.

A phase detector (PD) 30 compares a phase difference between the feedback frequency 28 and a reference frequency 32 to generate a first output 34. A switch 36 may select between the first output 34 and a precharge voltage 38, generated by a precharge circuit 40, to generate a PD voltage ("Vpd") 42. The switch 36 may be controlled by an open loop signal 50 to connect the PD voltage 42 to either the precharge voltage 38 or the first output 34 of the PD 30. The PD voltage 42 is received by a first LPF 52. The PIC enable signal 18, a precharge signal 54 and a slow mode signal 56 control a PIC 58, which also receives the PD voltage 42.

Figure 2:
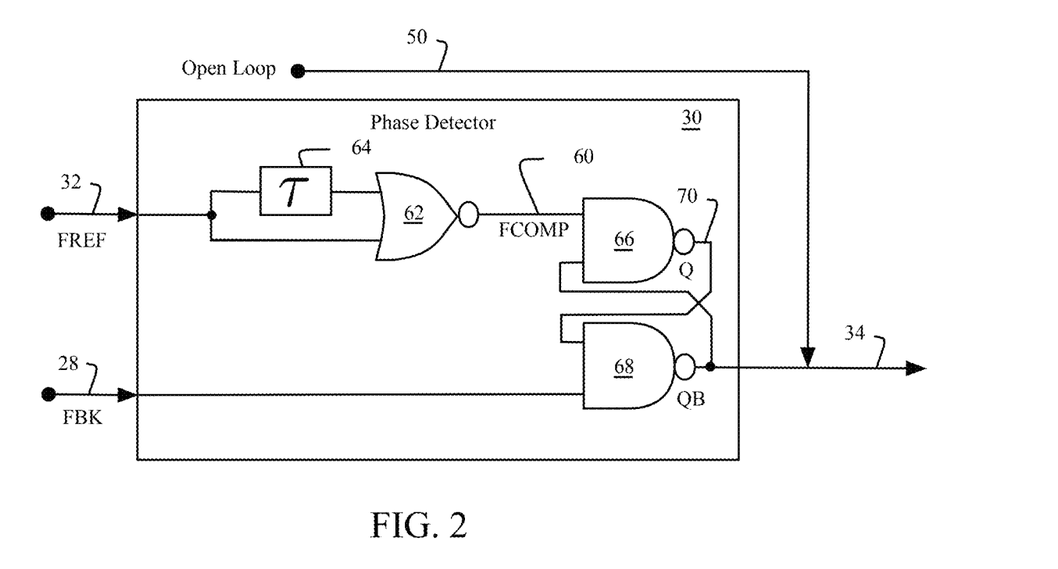
FIG. 2 is a schematic view of the phase detector of FIG. 1, in accordance with an embodiment of the present disclosure.

FIG. 2 shows further detail of an embodiment of the PD 30 of FIG. 1. The embodiment of the PD 30 may generate a comparison frequency ("FCOMP") 60 from a two input NOR gate 62. The NOR gate 62 may double a frequency of the reference frequency 32 with a delay circuit 64. A cross coupled pair of two input NAND gates 66 and 68 may respond to a phase difference between the comparison frequency 60 and the feedback frequency 28 to generate respective outputs 70 (Q) and 34 (QB).

Figure 3:
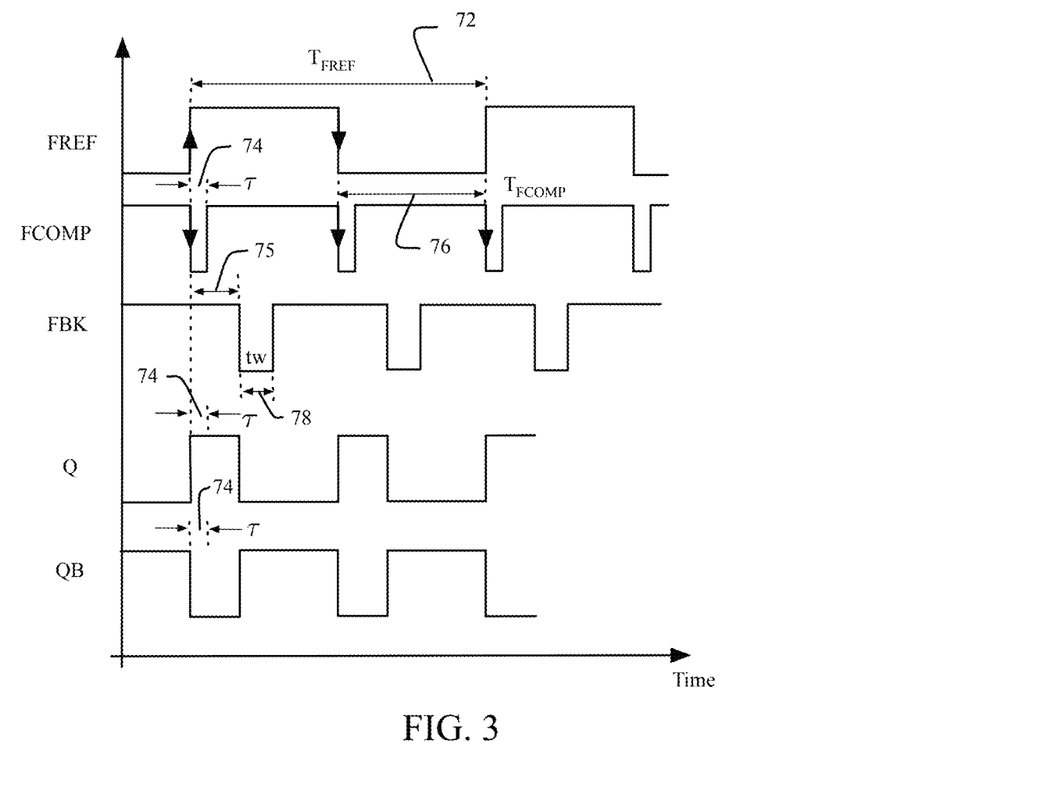
FIG. 3 is a graphical view of a timing diagram of the phase detector of FIG. 2, in accordance with an embodiment of the present disclosure.

FIG. 3 shows a timing relationship of the embodiment of FIG. 2. Specifically, the reference frequency 32 may have a period ("Tref") 72. In one embodiment, the reference frequency 32 is set to a target frequency, which the VCO output 22 may also generate as an integer multiple defined by the divisor 26. The comparison frequency 60 is generated as a pulse with a width 74 determined by the delay circuit 64. In one embodiment, the Q 70 and QB output 34 will each have a pulse width 75 determined by a phase delay between a falling edge of the comparison frequency 60 and the feedback frequency 28. Other embodiments of the phase detector 30 may also be used in the embodiment 10 of FIG. 1 by measuring the phase delay between rising edges rather than falling edges. In FIG. 3, the NOR gate 62 and delay circuit 64 operate as a frequency doubler. Hence, a period 76 of the comparison frequency 60 may be half of the period 72 of the reference frequency 32. In one embodiment, the feedback divider 24 two consecutive rising edges of the VCO output 22 are used to generate a pulse with a width 78 and a subsequent pulse defined by the divisor 26.

Figure 4:
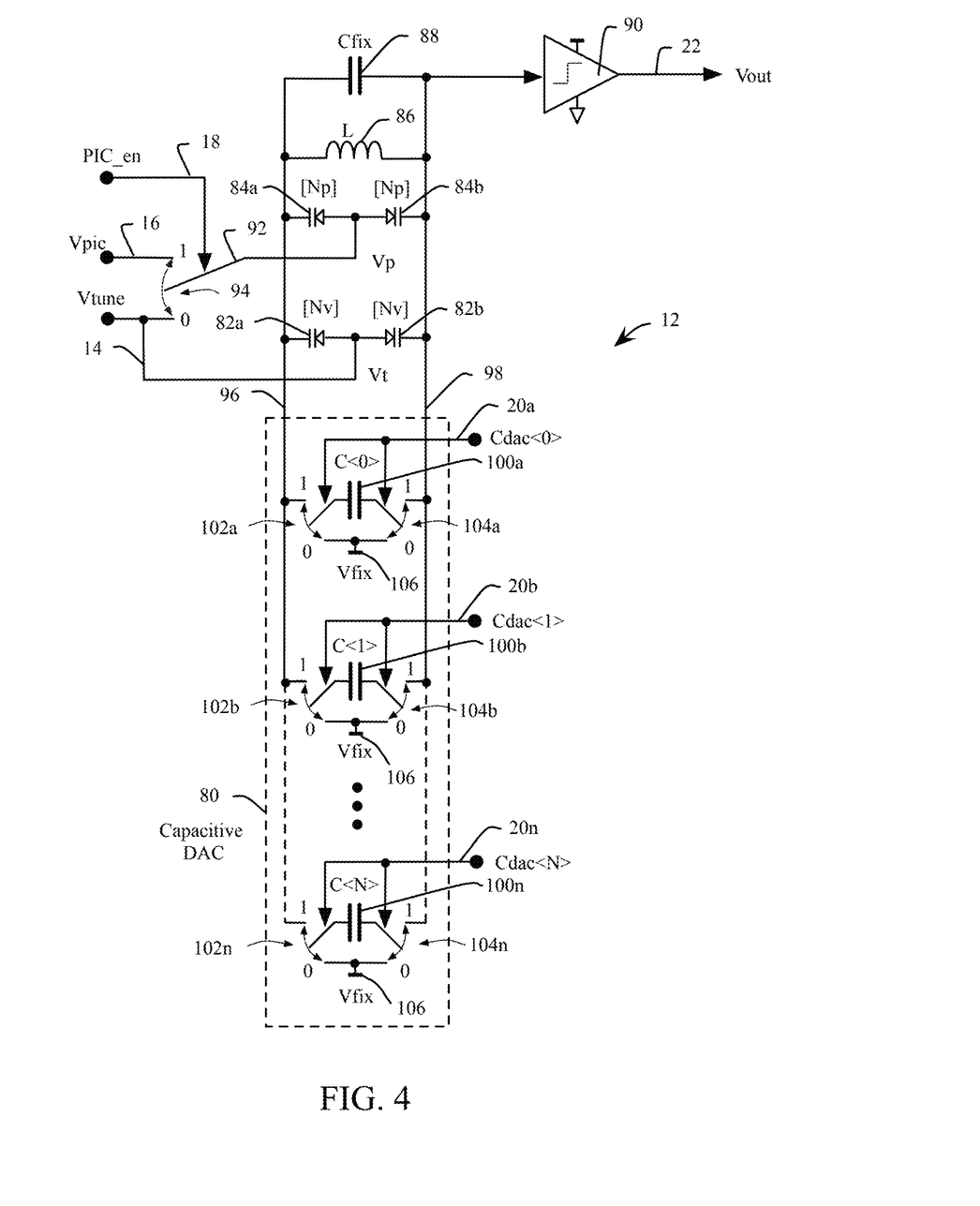
FIG. 4 is a schematic view of the VCO of FIG. 1, in accordance with an embodiment of the present disclosure.

FIG. 4 shows further detail of the VCO 12 of FIG. 1. The VCO 12 includes a capacitive DAC 80, a first set of varicaps 82a and 82b (generally 82) and a second set of varicaps 84a and 84b (generally 84). The term varicap as used herein is a variable capacitance diode, used to exploit a voltage-dependent capacitance of a reverse biased p-n junction. The capacitors of the capacitive DAC, the sets of varicaps 82 and 84, an inductor 86 and a fixed capacitor 88 form a resonant circuit configured to resonant at the VCO frequency. In one embodiment, a Schmitt trigger device 90 may be used to convert the resonance into a square wave at the VCO frequency on the VCO output 22. In another embodiment, one or more of the varicaps may be substituted with another variable capacitance device to change a respective capacitive value based on an applied bias voltage. In FIG. 4, each of the first set of varicaps 82 are biased with the first error voltage Vtune 14. Each of the second set of varicaps 84 are biased with a signal 92. The signal 92 is determined by a switch 94, which selects the first error voltage Vtune 14, when the PIC 58 is disabled, or the second error voltage Vpic 16, when the PIC 58 is enabled. In one embodiment, the PIC 58 is enabled when the PIC_en 18 is high. The polarity of the signals used to control the embodiment 10 may be reversed with matching reversal of the polarity of the circuits being controlled. A selection of the capacitors of the capacitive DAC may be used to define a resonant frequency across the nodes 96 and 98, (and thus at the VCO output 22) being close to a desired target frequency. The capacitance of the first and second set of varicaps 82 and 84 are adjustable to remove a residual frequency error between the resonant frequency and the target frequency.

During a respective calibration mode for the non-coherent and coherent modes of operating the embodiment 10 of the PLL, one or more of the plurality of capacitors 100a, 100b through 100n (generally 100) are selected with a respective capacitive DAC selection 20a, 20b through 20n (generally 20). Each selected capacitor 100 may be connected across the nodes 96 and 98 with a pair of switches 102a, 102b through 102n (generally 102) and 104a, 104b through 104n (generally 104). Similarly, each deselected capacitor 100 may be connected to a fixed voltage reference 106 with the respective switches 102 and 104.

Figure 5:
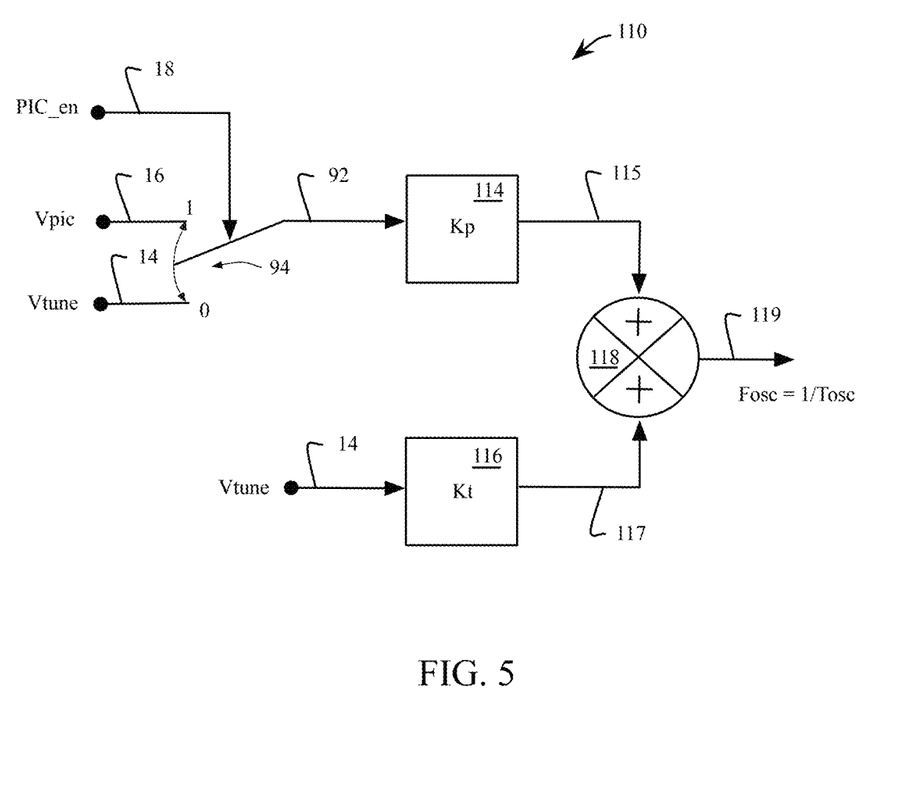
FIG. 5 is a schematic view of a transfer function of the VCO of FIG. 4, in accordance with an embodiment of the present disclosure.

FIG. 5 shows a transfer function 110 of the VCO 12 and more particularly the transfer function of the sets of varicaps 82 and 84 in the VCO 12. With continued reference to FIG. 4, a proportional gain 114 modifies the signal 92 to generate a signal 115. For example, the second set of varicaps 84 may modify an apparent capacitance of the combination of varicaps with the bias signal 92. Similarly, another proportional gain 116 modifies the first error voltage 14 to generate a signal 117. For example, the first set of varicaps 82 may modify an apparent capacitance of the combination of varicaps with the first error voltage 14. The error signal 115 and 117 may be combined with a summation function 118 to produce the VCO frequency 119.

Figure 6:
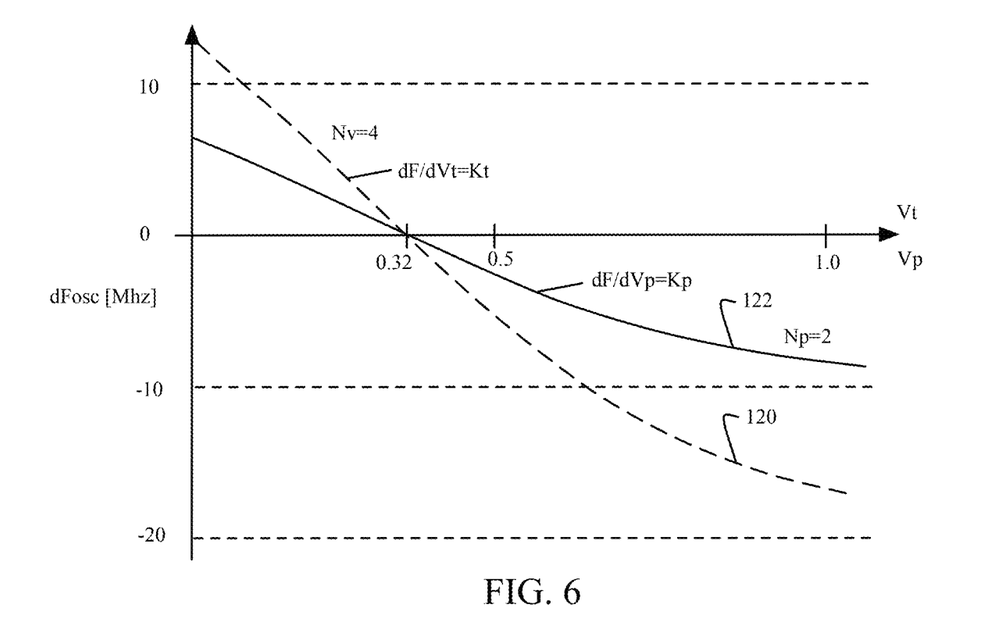
FIG. 6 is a graphical view of a change in frequency of the VCO with respect to a change in the apparent number of varicaps of the VCO of FIG. 4.
Figure 7:
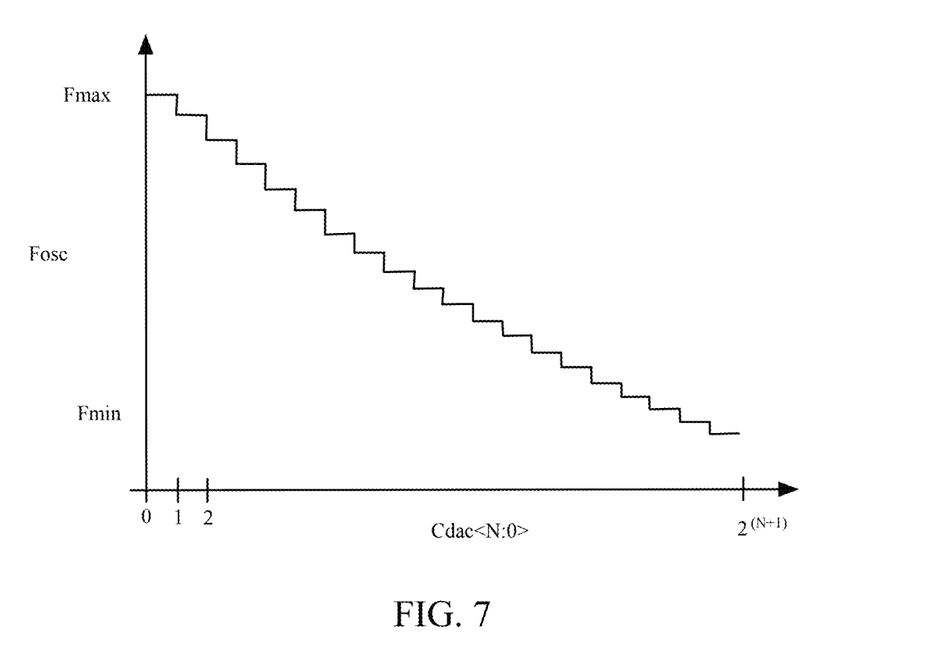
FIG. 7 is a graphical view of a change in frequency of the VCO with respect to a change in the number of selected capacitors of a capacitive DAC of the VCO of FIG. 4.

FIG. 6 shows a graphical representation of a change in VCO frequency with respect to a first apparent number 120 of the first set of varicaps 82, and a second apparent number 122 of the second set of varicaps 84. By changing the varicap bias voltage to the varicaps shown in FIG. 4, the total capacitance of the VCO 12, including the capacitive DAC 80 and fixed capacitance 88, may be changed and thus the generated resonant frequency and VCO frequency at the VCO output 22. In one embodiment, an optimal precharge voltage 38 may be selected based on the first error voltage (Vtune) 14 minimizing a change to the first apparent number 120 of the first set of varicaps 82, and the second apparent number 122 of the second set of varicaps 84. FIG. 7 shows a graphical representation of a change in frequency of the VCO 12 by changing the number of capacitors 100 selected in the capacitive DAC 80.

Figure 8:
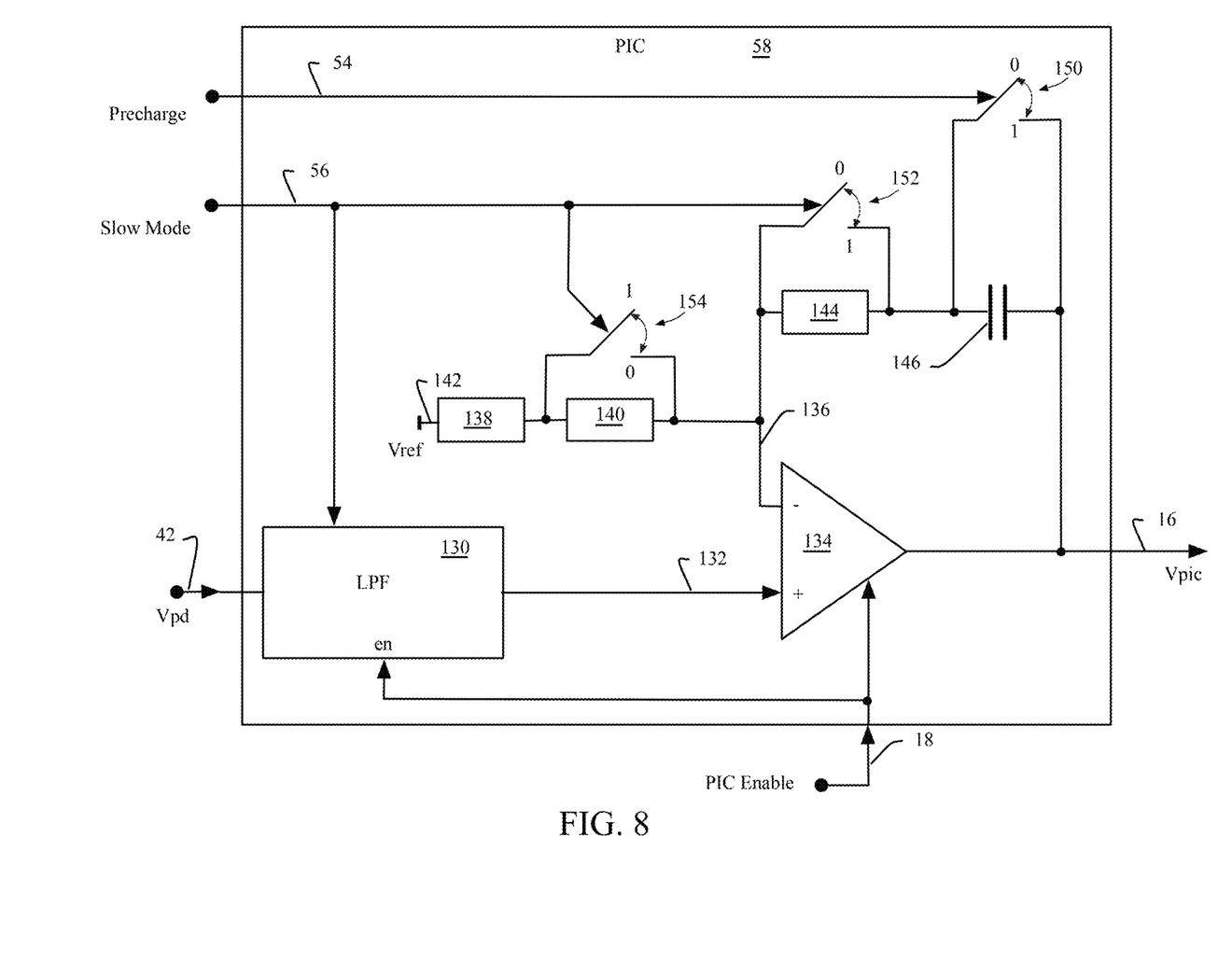
FIG. 8 is a schematic view of a Proportional and Integral Controller (PIC) of FIG. 1, in accordance with an embodiment of the present disclosure.

FIG. 8 shows further detail of the PIC 58 of FIG. 1. The PIC 58 includes an LPF 130, which filters the PD voltage 42 to produce a filter signal 132. The LPF 130 may be enabled by the PIC_En 18 signal and have a cutoff frequency adjusted by the slow mode signal 56. The filtered signal 132 may be amplified by an amplifier 134 to produce the second error voltage Vpic 16. The amplifier 134 may have an adjustable gain by controlling the inverted input signal 136. A first input resistor 138 and a second input resistor 140 are serially connected between the inverting input 136 and a fixed reference voltage 142. A feedback resistor 144 and a feedback capacitor 146 are serially connected between the second error voltage Vpic 16 (e.g., output of the amplifier 134) and the inverting input 136. A switch 150 controlled by the Precharge signal 54 forms a first selectable shunt across the feedback capacitor 146. A switch 152 controlled by the slow mode 56 forms a second selectable shunt across the feedback resistor 140. A switch 154 controlled by the slow mode 56 forms a third selectable shunt across the second input resistor 140. In one embodiment, a resistance of the second input resistor 140 is larger than a resistance of the first input resistor 138. The capacitor 146 in the feedback path of the amplifier 134 provides an integrator function and also gives the PIC 58 a time variant proportional gain.

Figure 9:
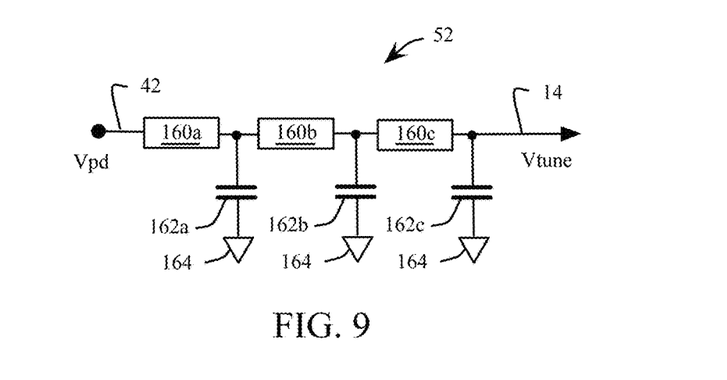
FIG. 9 is a schematic view of the LPF of FIG. 1, in accordance with an embodiment of the present disclosure.

FIG. 9 shows further detail of the LPF 52 of FIG. 1. The LPF 52 (e.g., the first LPF) filters the PD voltage 42 and generates a first error voltage (Vtune) 14. In one embodiment, the LPF 52 includes three stages including serially connected resistors 160a, 160b and 160c (generally 160), with respective capacitors 162a, 162b and 162c (generally 162) connected to a fixed potential (e.g., a ground voltage) 164.

Figure 10:
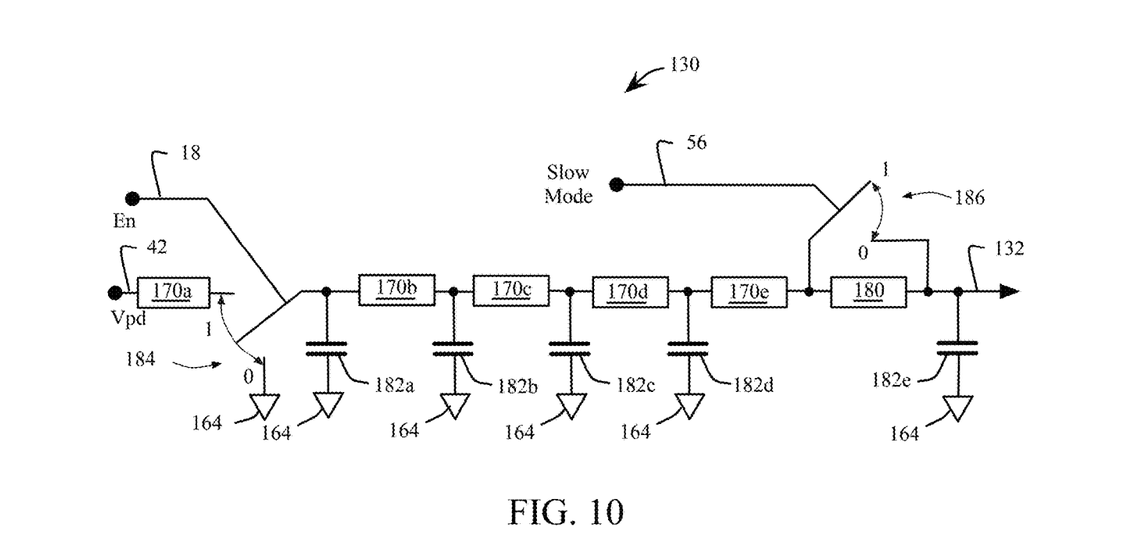
FIG. 10 is a schematic view of the LPF of the PIC of FIG. 8, in accordance with an embodiment of the present disclosure.
Figure 11:
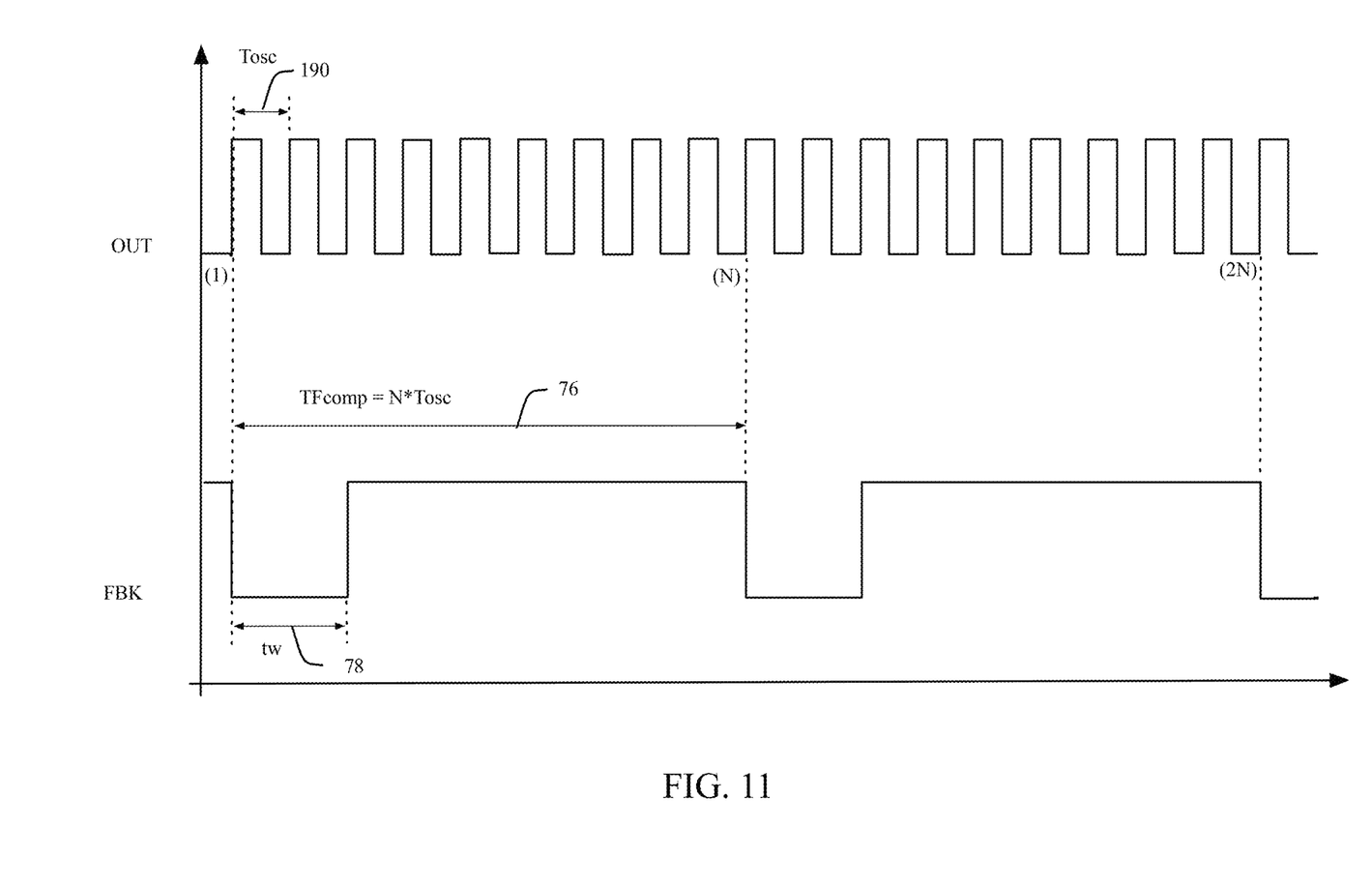
FIG. 11 is a graphical view of a timing diagram of the feedback divider of FIG. 1, in accordance with an embodiment of the present disclosure.

FIG. 10 shows further detail of the LPF 130 in the PIC of FIG. 8. The LPF 130 (e.g., the second LPF) filters the PD voltage 42 and generates a filtered signal 132, (which is subsequently amplified by the amplifier 134). In one embodiment, the LPF 130 includes five stages including serially connected resistors 170a, 170b, 170c, 170d and 170e (generally 170). The last stage further includes a resistor 180 serially connected to the resistor 170e. Each stage includes a capacitor 182a, 182b, 182c, 182d and 182e (generally 182) connected to the fixed potential 164. The LPF 130 may be disabled with the En signal 18. The En signal 18 controls a switch 184, which may connect the first stage (e.g., at the output of the resistor 170a to the fixed potential 164. In one embodiment, the LPF 130 has a higher cutoff frequency than the LPF 52. The cutoff frequency of the LPF 130 may also be adjusted lower by shunting the resistor 180 with a switch 186 controlled by the slow mode 56. FIG. 11 shows a timing relationship of the feedback divider 24 of FIG. 1. With reference to FIG. 3 and FIG. 11, in one embodiment, the feedback divider 24 receives a VCO frequency with a period 190. The feedback frequency (FBK) 28 may generate a pulse, each time that N cycles of the signal on the VCO output 22 have elapsed.

Figure 12:
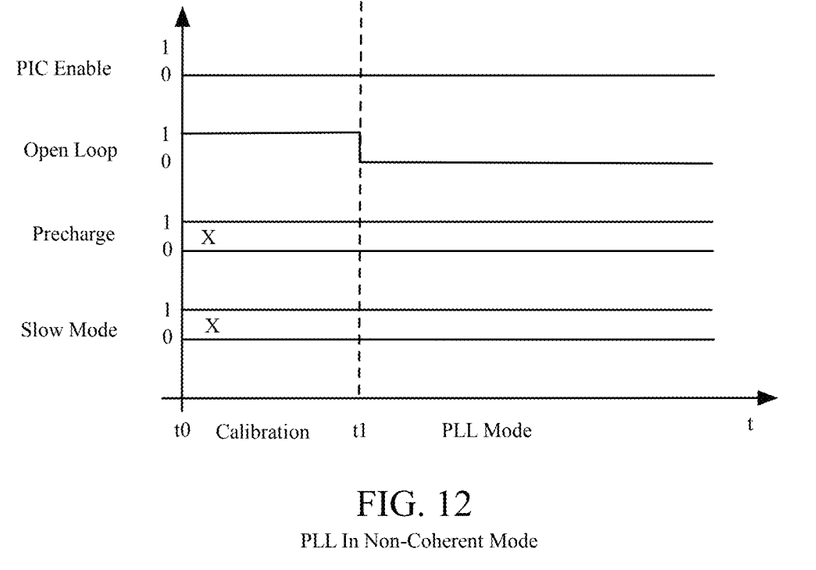
FIG. 12 is a graphical view of a timing diagram of the PLL of FIG. 1 in a non-coherent mode, in accordance with an embodiment of the present disclosure.
Figure 13:
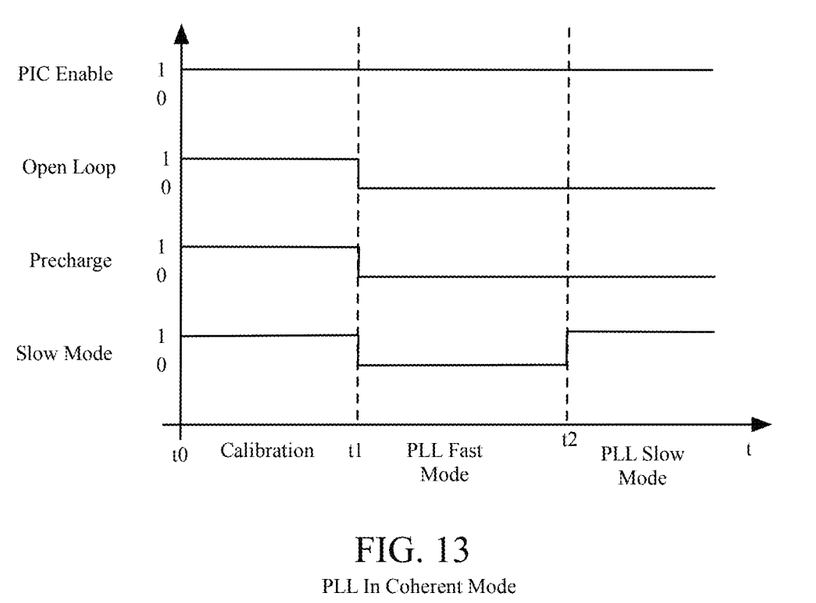
FIG. 13 is a graphical view of a timing diagram of the PLL of FIG. 1 in a coherent mode, in accordance with an embodiment of the present disclosure.

FIG. 12 and FIG. 13 show a timing relationship of the non-coherent mode and the coherent mode respectively. With reference to FIG. 1, FIG. 4, FIG. 8 and FIG. 12, the PLL 10 is set in a non-coherent mode by disabling the PIC enable signal 18. Disabling the PIC enable, will disable the amplifier 134 and LPF 130 within the PIC 58, thereby reducing power at the expense of coherency. The second set of varicaps 84 will also be biased by the first error voltage (Vtune) 14. The PLL 10 is set in a calibration mode between t0 and t1, by activating the open loop 50 signal, which disconnects the phase detector 30 from the LPF 52 and the PIC 58 and connects the precharge circuit 40 to the LPF 52 and disabled PIC 58. The LPF 52 will set the first error voltage (Vtune) 14 to Vpd 42, which is charged to the precharge voltage ("Vpre") 38. When a steady state is reached, a best combination of the capacitors 100 of the VCO 12 are determined, to minimize a residual frequency error ("Ferr") between a target frequency ("Ftarget") and the VCO frequency ("Fosc") generated at the VCO output 22. The best combination of capacitors 100 may be indicated by the capacitive DAC selection 20. In one example, the best combination of capacitors 100 may be found by a best fit algorithm determined during a production test.

After t1 in FIG. 12, the PLL loop enters a PLL Mode, where the open loop signal 50 is inactivated, thereby connecting the phase detector 30 to LPF 52 and the disabled PIC 58. The capacitive DAC selection 20 may be set to select the best combination of capacitors 100 to minimize the residual frequency error ("Ferr"). In one embodiment, the divisor value 26 of the feedback divider 24 is set to the target frequency divided by the comparison frequency 60 (see FIG. 2). The generated VCO frequency ("Fosc") will then change from its initial value (Fosc=Ftarget+Ferr) to a steady state value equal to "Ftarget." The VCO gain may be modelled as a Kp (proportional gain related to the second set of varicaps 84) 114 and Kt (another proportional gain related to the first set of varicaps 82) 116, as shown in FIG. 5. In steady state, the first error voltage ("Vtune") 14 may be described by the following equation:

$$\text{Vtune} = \text{Vpre} + \text{Ferr}/[Kp+Kt] \qquad [1]$$

For the phase detector 30 supplied between voltage VDD (not shown) and 0V (not shown), a phase difference between the comparison frequency 60 and the feedback frequency 28 may be described by the following equation:

$$\text{delta-phase} = 2\pi/\text{VDD} \times (\text{VDD} - \text{Vpre} + \text{Ferr}/[Kp+Kt]) \qquad [2]$$

The phase difference ("delta-phase") at the input of the phase detector 30 depends on the residual frequency error ("Ferr") after calibration, hence the PLL is non-coherent in phase. π

With reference to FIG. 1, FIG. 4, FIG. 8, FIG. 9, FIG. 10 and FIG. 13, the PLL 10 is set in a coherent mode by enabling the PIC enable signal 18. The PLL 10 is set in a calibration mode between t0 and t1, by activating the open loop 50 signal, which disconnects the phase detector 30 from the LPF 52 and the PIC 58 and connects the precharge circuit 40 to the first LPF 52 and the second LPF 130 within the PIC 58. The LPF 52 and LPF 130 will set the first error voltage (Vtune) 14 and the filtered signal 132 to Vpd 42 respectively, where Vpd 42 is charged to the precharge voltage ("Vpre") 38. During the calibration mode, the feedback capacitor 146 is shunted with the first switch 150 controlled by the precharge signal 54. The amplifier 134 is set in unity gain mode by shunting the feedback resistor 144 with the second switch 152 controlled by the slow mode 56. The input resistance to the amplifier 134 is also increased by removing a shunt across the second input resistor 140 with the third switch 154 controlled by the slow mode 56. With the amplifier 134 thus configured in a unity gain mode, the second error voltage ("Vpic") 16 is charged to the precharge voltage 38.

Similar to the non-coherent mode, when a steady state is reached, a best combination of the capacitors 100 of the VCO 12 are determined, to minimize a residual frequency error ("Ferr") between a target frequency ("Ftarget") and the VCO frequency ("Fosc") generated at the VCO output 22. However, unlike the non-coherent mode, the calibration of the coherent mode biases the second set of varicaps 84 to the second error voltage ("Vpic") 16, while the first set of varicaps 82 remains biased to the first error voltage ("Vtune") 14. The best combination of capacitors 100 may be indicated by the capacitive DAC selection 20. In one example, the best combination of capacitors 100 may be found by a best fit algorithm determined during a production test.

The coherent mode includes a fast mode for quick PLL locking followed by a slow mode, where a steady state condition may be reached with a same PLL loop bandwidth and stability conditions as when the PLL operates in the non-coherent mode. In the fast mode, the slow mode signal is deactivated during the time period t1 to t2 shown in FIG. 13, thereby removing the shunt across the feedback resistor 144 and reducing the input resistance to the amplifier 134 by shunting the second input resistor 140. The precharge signal 54 is also deactivated, thereby removing the shunt across the feedback capacitor 146. The capacitive DAC selection 20 is also set to select the best combination of capacitors as determined during the calibration mode. The divisor value 26 of the feedback divider 24 is set to the target frequency divided by the comparison frequency 60. With the gain function of the PIC 58, the VCO frequency on the VCO output 22 will change from its initial value (Fosc=Ftarget+Ferr) to it final steady state value equal to "Ftarget." The PIC 58 will also force the first error value ("Vtune") to equal the first output ("Vref") 34. The second error voltage ("Vpic") will change from the precharge voltage to force the VCO frequency ("Fosc") to equal the target frequency ("Ftarget").

Due to the proportional gain of the PIC 58 (e.g., Gpic_prop=1+Rfb/Ri, where Rfb is the feedback resistor 144 and Ri is input resistor 138), the "apparent" number of varicaps 82 and 84 for a PLL bandwidth calculation is artificially increased to Gpic_prop*Np+Nv, (where Np is the number of the first set of varicaps 82 and Nv is the number of the second set of varicaps 84). Accordingly the PLL may converge faster than in the non-coherent mode. Since the PD voltage 42 may now be independent of the residual frequency error Ferr, the phase difference between the comparison frequency 60 and the feedback frequency 28 may now be independent of Ferr, accordingly to the following equation:

$$\text{delta-phase} = 2\pi/\text{VDD} \times (\text{VDD} - \text{Vref}) \quad [3]$$

Accordingly, the PLL 10 may now be phase coherent because the delta-phase is constant and independent of the residual frequency error Ferr. After the PLL 10 has stabilized and locked onto the target frequency, a slow mode may be entered to improve stability. With reference to FIG. 1, FIG. 4, FIG. 8, FIG. 9, FIG. 10 and FIG. 13, the PLL 10 is switched from the fast mode to a slow mode by activating the slow mode signal after t2 in FIG. 13. With the precharge signal 54 inactive, the feedback capacitor 146 remains unshunted as in the fast mode. With the slow mode 56 active, the feedback resistor 144 is shunted and the input resistance to the amplifier 134 is increased by removing the shunt across the second input resistor 140. The cutoff frequency of the second LPF 130 is also increased by removing the shunt across the resistor 180. Accordingly, the PLL 10 bandwidth is decreased to be the same as when the PLL 10 is operated in the non-coherent mode. The PIC 58 proportional gain is set to unity (by shorting the feedback resistor 144), main the apparent number of varicaps 82 and 84 for the proportional path, equal to the number of varicaps in the non-coherent mode. The zero frequency of the PLL 10 is decreased and the PLL phase margin is increased to the same value as achieved during the non-coherent mode. Since the second LPF 130 is a higher order filter than the first LPF 52, switching the resistor 180 with the switch 186 does not have a significant impact on the PLL 10 output phase. In one embodiment, the switching elements of the PLL 10 are designed to minimize injection or glitching during state transitions.

Figure 14:
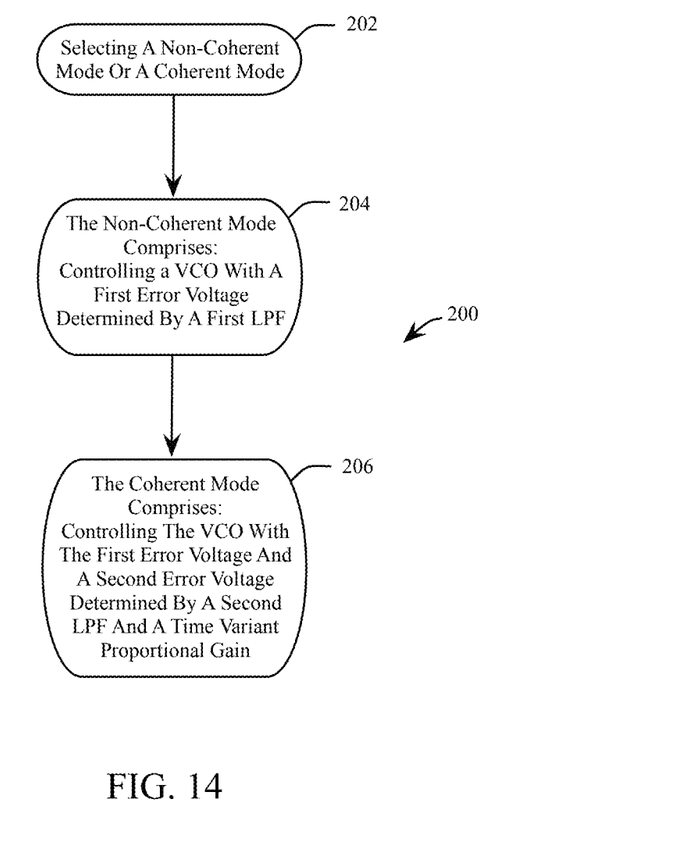
FIG. 14 is a flowchart representation of a method for operation of a dual mode PLL for phase coherent application, in accordance with an embodiment of the present disclosure.

FIG. 14 shows an embodiment 200 of a method of operation for a dual mode PLL for phase coherent application. With continued reference to FIG. 1, FIG. 8 and FIG. 14, at 202 a non-coherent or a coherent mode is selected. At 204, the non-coherent mode comprises controlling a VCO 12 with a first error voltage 14 determined by a first LPF 52. At 206, the coherent mode comprises controlling the VCO 12 with the first error voltage 14 and a second error voltage 16 determined by a second LPF 130 and a time variant proportional gain (e.g., the amplifier 134 with input and feedback components as shown in FIG. 8).

Figure 15:
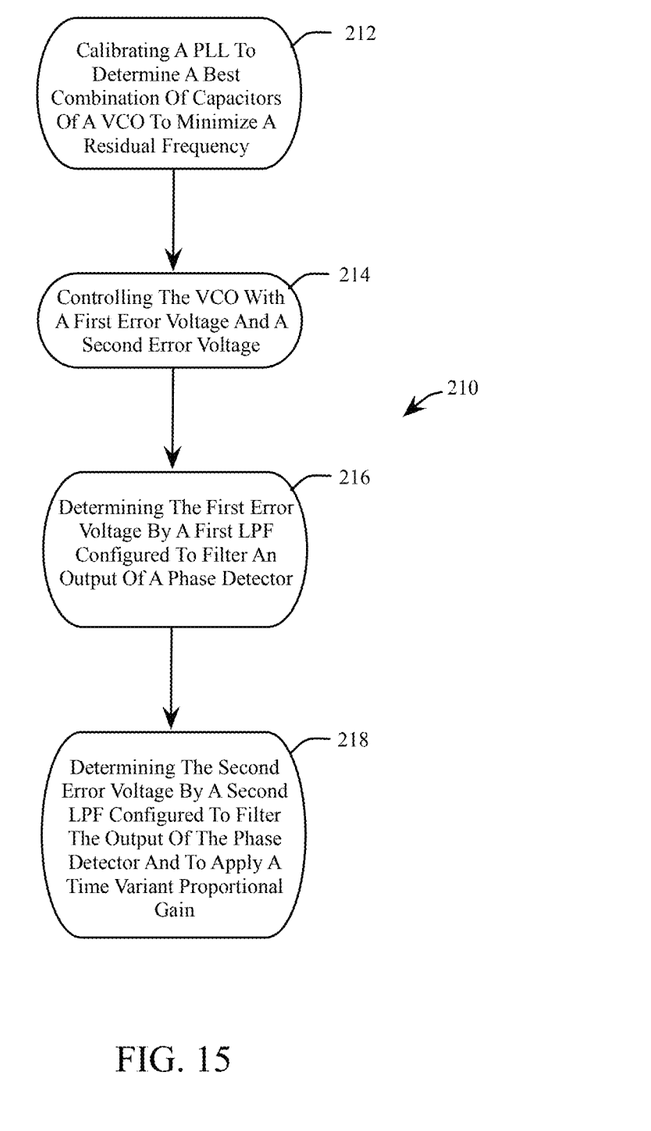
FIG. 15 is a flowchart representation of another method for operation of a dual mode PLL for phase coherent application, in accordance with an embodiment of the present disclosure.

FIG. 15 shows an embodiment 210 of a method of operation for a dual mode PLL for phase coherent application. With continued reference to FIG. 1, FIG. 4, FIG. 8 and FIG. 15, at 212 the PLL 10 is calibrated to determine a best combination of capacitors 100 of a VCO 12 to minimize a residual frequency. At 214, the VCO 12 is controlled with a first error voltage 14 and a second error voltage 16. At 216, the first error voltage is determined by a first LPF 52 configured to filter an output 34 of a phase detector 30. At 218, the second error voltage 16 is determined by a second LPF 130 configured to filter the output 34 of the phase detector and to apply a time variant proportional gain (e.g., the amplifier 134 with input and feedback components as shown in FIG. 8).

As will be appreciated, at least some of the embodiments as disclosed include at least the following. In one embodiment, a method of operation for a dual mode Phase-Locked Loop (PLL) for phase coherent application comprises separately selecting one of a non-coherent mode and a coherent mode. The non-coherent mode comprises controlling a Voltage Controlled Oscillator (VCO) with a first error voltage determined by a first Low Pass Filter (LPF), the first LPF configured to filter a first output of a phase detector, the phase detector configured to determine a phase difference between a reference frequency and a feedback signal derived from a VCO frequency generated by the VCO. The coherent mode comprises controlling the VCO with the first error voltage and a second error voltage determined by a second LPF of a Proportional and Integral Controller (PIC) configured to filter the first output of the phase detector and by a time variant proportional gain configured to modify a second output of the second LPF.

Alternative embodiments of the method of operation for a dual mode Phase-Locked Loop (PLL) for phase coherent application include one of the following features, or any combination thereof. The PLL is calibrated to determine a best combination of a plurality of capacitors of the VCO to minimize a residual frequency error between a target frequency and the VCO frequency. Calibrating the PLL during the non-coherent mode comprises disabling the PIC, decoupling the phase detector from the first LPF, driving a first input of the first LPF to a precharged voltage, thereby driving the first error voltage to the precharged voltage, and driving a first set of varicaps of the VCO and a second set of varicaps of the VCO to the first error voltage. Calibrating the PLL during the coherent mode comprises decoupling the phase detector from the first LPF and from the second LPF, driving a first input of the first LPF to a precharged voltage, thereby driving the first error voltage to the precharged voltage, configuring the time variant proportional gain to comprise a unity gain, driving a second input of the second LPF to the precharged voltage, thereby driving the second error voltage to the precharged voltage, and driving a first set of varicaps of the VCO with the first error voltage and a second set of varicaps of the VCO with the second error voltage. Configuring the time variant proportional gain to comprise the unity gain comprises shunting a feedback capacitor and a feedback resistor of an amplifier of the PIC, and increasing an input resistance of an inverting input of the amplifier. The coherent mode comprises a fast mode and a slow mode, wherein the fast mode is configured to increase a bandwidth and a cutoff frequency of the PLL, and the slow mode is configured to match the bandwidth and a phase margin of the PLL in the non-coherent mode. The fast mode comprises coupling the phase detector to the first LPF and to the second LPF, configuring the time variant proportional gain to comprise a proportional gain equal to a value of one plus a ratio of a feedback resistance of an amplifier of the PIC to an input resistance of the amplifier, and modifying an apparent number of varicaps of the VCO by driving a first set of varicaps with the first error voltage and a second set of varicaps with the second error voltage. The slow mode comprises shunting a feedback resistor of an amplifier of the PIC, increasing an input resistance of an inverting input the amplifier, and reducing a cutoff frequency of the second LPF. The VCO frequency is generated from a resonant frequency formed by an inductor and a capacitance, wherein the capacitance comprises a best combination of a plurality of capacitors of the VCO coupled to a first set of varicaps controlled by the first error voltage and coupled to a second set of varicaps controlled by the second error voltage. The feedback signal is derived by dividing the VCO frequency by a comparison frequency of the phase detector.

In another embodiment, an apparatus comprises a phase detector configured to determine a phase difference between a reference frequency and a feedback signal derived from a VCO frequency. A first Low Pass Filter (LPF) is configured to filter a first output of the phase detector and to control a first set of variable capacitance devices. A Proportional and Integral Controller (PIC) comprises a second LPF and a time variant proportional gain and integrator, the second LPF configured to filter the first output of the phase detector and the time variant proportional gain and integrator configured to modify a second output of the second LPF to control a second set of variable capacitance devices. A Voltage Controlled Oscillator (VCO) is configured to generate the VCO frequency from a resonance between a plurality of capacitors, the first set of variable capacitance devices, the second set of variable capacitance devices and an inductor. A feedback divider is configured to generate the feedback signal by dividing the VCO frequency by a comparison frequency of the phase detector.

Alternative embodiments of the apparatus include one of the following features, or any combination thereof. The second LPF comprises a higher cutoff frequency than the first LPF. The second LPF comprises an adjustable cutoff frequency. The time variant proportional gain and integrator of the PIC is configured to be modified with a first shunt across a feedback capacitor of an amplifier, a second shunt across a feedback resistor of the amplifier, and a third shunt across one of a plurality of serially connected input resistors connected to an inverting input of the amplifier. The VCO is configured to modify a first capacitance of the first set of variable capacitance devices with a first error voltage generated by the first LPF, to modify a second capacitance of the second set of variable capacitance devices with the first error voltage during a non-coherent mode of the PLL, and to modify the second capacitance with a second error voltage generated by the PIC during a coherent mode of the PLL.

In another embodiment, a method of operation for a dual mode Phase-Locked Loop (PLL) for phase coherent application comprises calibrating the PLL to determine a best combination of a plurality of capacitors of a Voltage Controlled Oscillator (VCO) to minimize a residual frequency error between a target frequency and a VCO frequency generated by the VCO. The VCO is controlled with a first error voltage and a second error voltage. The first error voltage is determined by a first Low Pass Filter (LPF), the first LPF configured to filter a first output of a phase detector, the phase detector configured to determine a phase difference between a reference frequency and a feedback signal derived from the VCO frequency. The second error voltage is determined by a second LPF of a Proportional and Integral Controller (PIC) configured to filter the first output of the phase detector and by a time variant proportional gain configured to modify a second output of the second LPF, wherein the first error voltage and the second error voltage modify a respective capacitance of a respective set of variable capacitance devices configured to resonate with the best combination of capacitors and an inductor to generate the VCO frequency.

Alternative embodiments of the method of operation for a dual mode Phase-Locked Loop (PLL) for phase coherent application include one of the following features, or any combination thereof. A fast mode is configured to increase a bandwidth and a cutoff frequency of the PLL. The phase detector is coupled to the first LPF and to the second LPF, the time variant proportional gain is configured to comprise a proportional gain equal to a value of one plus a ratio of a feedback resistance of an amplifier of the PIC to an input resistance of the amplifier, and an apparent number of variable capacitance devices of the VCO is modified by driving the respective set of variable capacitance devices with the first error voltage and the second error voltage. A slow mode is configured to match the bandwidth and a phase margin of the PLL between a coherent mode and a non-coherent mode. A feedback resistor of an amplifier of the PIC is shunted, an input resistance of an inverting input the amplifier is increased, and an output resistance of the second LPF is increased.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of operation for a dual mode Phase-Locked Loop (PLL) for phase coherent application comprising:
    separately selecting a non-coherent mode and a coherent mode,
    wherein the non-coherent mode includes controlling a Voltage Controlled Oscillator (VCO) with a first error voltage determined by a first Low Pass Filter (LPF), the first LPF configured to filter a first output of a phase detector, the phase detector configured to determine a phase difference between a reference frequency and a feedback signal derived from a VCO frequency generated by the VCO; and
    wherein the coherent mode includes controlling the VCO with the first error voltage and a second error voltage determined by a second LPF of a Proportional and Integral Controller (PIC) configured to filter the first output of the phase detector and by a time variant proportional gain configured to modify a second output of the second LPF.

2. The method of claim 1 further comprising calibrating the PLL to determine a best combination of a plurality of capacitors of the VCO to minimize a residual frequency error between a target frequency and the VCO frequency.

3. The method of claim 2 wherein calibrating the PLL during the non-coherent mode comprises:
    disabling the PIC;
    decoupling the phase detector from the first LPF;
    driving a first input of the first LPF to a precharged voltage, thereby driving the first error voltage to the precharged voltage; and
    driving a first set of varicaps of the VCO and a second set of varicaps of the VCO to the first error voltage.

4. The method of claim 2 wherein calibrating the PLL during the coherent mode comprises:

decoupling the phase detector from the first LPF and from the second LPF;

driving a first input of the first LPF to a precharged voltage, thereby driving the first error voltage to the precharged voltage;

configuring the time variant proportional gain to comprise a unity gain;

driving a second input of the second LPF to the precharged voltage, thereby driving the second error voltage to the precharged voltage; and driving a first set of varicaps of the VCO with the first error voltage and a second set of varicaps of the VCO with the second error voltage.

5. The method of claim 4 wherein configuring the time variant proportional gain to comprise the unity gain comprises:

shunting a feedback capacitor and a feedback resistor of an amplifier of the PIC; and increasing an input resistance of an inverting input of the amplifier.

6. The method of claim 1 wherein:

the coherent mode comprises a fast mode and a slow mode;

the fast mode is configured to increase a bandwidth and a cutoff frequency of the PLL; and the slow mode is configured to match the bandwidth and a phase margin of the PLL in the non-coherent mode.

7. The method of claim 6 wherein the fast mode comprises:

coupling the phase detector to the first LPF and to the second LPF;

configuring the time variant proportional gain to comprise a proportional gain equal to a value of one plus a ratio of a feedback resistance of an amplifier of the PIC to an input resistance of the amplifier; and modifying an apparent number of varicaps of the VCO by driving a first set of varicaps with the first error voltage and a second set of varicaps with the second error voltage.

8. The method of claim 6 wherein the slow mode comprises:

shunting a feedback resistor of an amplifier of the PIC;

increasing an input resistance of an inverting input the amplifier; and reducing a cutoff frequency of the second LPF.

9. The method of claim 1 further comprising:

generating the VCO frequency from a resonant frequency formed by an inductor and a capacitance, wherein the capacitance comprises a best combination of a plurality of capacitors of the VCO coupled to a first set of varicaps controlled by the first error voltage and coupled to a second set of varicaps controlled by the second error voltage.

10. The method of claim 1 wherein the feedback signal is derived by dividing the VCO frequency by a comparison frequency of the phase detector.

11. An apparatus comprising:

a phase detector configured to determine a phase difference between a reference frequency and a feedback signal derived from a VCO frequency;

a first Low Pass Filter (LPF) configured to filter a first output of the phase detector and to control a first set of variable capacitance devices;

a Proportional and Integral Controller (PIC) that includes a second LPF and a time variant proportional gain and integrator, the second LPF configured to filter the first output of the phase detector and the time variant proportional gain and integrator configured to modify a second output of the second LPF to control a second set of variable capacitance devices;

a Voltage Controlled Oscillator (VCO) configured to generate the VCO frequency from a resonance between a plurality of capacitors, the first set of variable capacitance devices, the second set of variable capacitance devices and an inductor; and a feedback divider configured to generate the feedback signal by dividing the VCO frequency by a comparison frequency of the phase detector.

12. The apparatus of claim 11 wherein the second LPF comprises a higher cutoff frequency than the first LPF.

13. The apparatus of claim 11 wherein the second LPF comprises an adjustable cutoff frequency.

14. The apparatus of claim 11 wherein the time variant proportional gain and integrator of the PIC is configured to be modified with a first shunt across a feedback capacitor of an amplifier, a second shunt across a feedback resistor of the amplifier, and a third shunt across one of a plurality of serially connected input resistors connected to an inverting input of the amplifier.

15. The apparatus of claim 11 wherein the VCO is configured:

to modify a first capacitance of the first set of variable capacitance devices with a first error voltage generated by the first LPF;

to modify a second capacitance of the second set of variable capacitance devices with the first error voltage during a non-coherent mode of the PLL; and to modify the second capacitance with a second error voltage generated by the PIC during a coherent mode of the PLL.

16. A method of operation for a dual mode Phase-Locked Loop (PLL) for phase coherent application comprising:

calibrating the PLL to determine a best combination of a plurality of capacitors of a Voltage Controlled Oscillator (VCO) to minimize a residual frequency error between a target frequency and a VCO frequency generated by the VCO;

controlling the VCO with a first error voltage and a second error voltage;

determining the first error voltage by a first Low Pass Filter (LPF), the first LPF configured to filter a first output of a phase detector, the phase detector configured to determine a phase difference between a reference frequency and a feedback signal derived from the VCO frequency; and determining the second error voltage by a second LPF of a Proportional and Integral Controller (PIC) configured to filter the first output of the phase detector and by a time variant proportional gain configured to modify a second output of the second LPF, wherein the first error voltage and the second error voltage modify a respective capacitance of a respective set of variable capacitance devices configured to resonate with the best combination of capacitors and an inductor to generate the VCO frequency.

17. The method of claim 16 further comprising a fast mode configured to increase a bandwidth and a cutoff frequency of the PLL.

18. The method of claim 17 comprising:

coupling the phase detector to the first LPF and to the second LPF;

configuring the time variant proportional gain to comprise a proportional gain equal to a value of one plus a ratio of a feedback resistance of an amplifier of the PIC to an input resistance of the amplifier; and modifying an apparent number of variable capacitance devices of the VCO by driving the respective set of variable capacitance devices with the first error voltage and the second error voltage.

19. The method of claim 16 further comprising a slow mode configured to match the bandwidth and a phase margin of the PLL between a coherent mode and a non-coherent mode.

20. The method of claim 19 comprising:

shunting a feedback resistor of an amplifier of the PIC;

increasing an input resistance of an inverting input of the amplifier; and increasing an output resistance of the second LPF.

* * * * *